United States Patent
Suga

(10) Patent No.: US 10,403,784 B2
(45) Date of Patent: Sep. 3, 2019

(54) LIGHT EMITTING DEVICE CONTROLLING A CURRENT INJECTION AMOUNT INTO AN ELECTRODE ACCORDING TO PIECES OF OPTICAL INFORMATION

(71) Applicant: CANON KABUSHIKI KAISHA, Tokyo (JP)

(72) Inventor: Takako Suga, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/218,461

(22) Filed: Jul. 25, 2016

(65) Prior Publication Data
US 2017/0047475 A1 Feb. 16, 2017

(30) Foreign Application Priority Data
Aug. 13, 2015 (JP) .................................. 2015-159791

(51) Int. Cl.
*H01L 33/00* (2010.01)
*G01B 9/02* (2006.01)
(Continued)

(52) U.S. Cl.
CPC ...... *H01L 33/0045* (2013.01); *G01B 9/02091* (2013.01); *H01L 33/06* (2013.01);
(Continued)

(58) Field of Classification Search
CPC ..... H01L 33/0045; H01L 33/30; H01L 33/10; H01L 33/06; H01L 33/24; H01L 33/38; G01B 9/02091
See application file for complete search history.

(56) References Cited

U.S. PATENT DOCUMENTS 6,097,743 A * 8/2000 Alphonse ............ H01L 33/0045
257/E33.054
6,714,566 B1 * 3/2004 Coldren .................. H01S 5/026
372/20
(Continued)

FOREIGN PATENT DOCUMENTS

CN 102683516 9/2012
CN 104662677 5/2015
(Continued)

OTHER PUBLICATIONS

A.T. Semenov, et al., "Spectral control in multisection AlGaAs SQW superluminescent diodes at 800 nm", Electronics Letters, Feb. 1, 1996, vol. 32, No. 3, pp. 255-256.
(Continued)

*Primary Examiner* — Michael P LaPage
(74) *Attorney, Agent, or Firm* — Venable LLP

(57) ABSTRACT

A light emitting device, particularly a super luminescent diode, includes an active layer provided between upper and lower electrodes for injecting electric current into the active layer. The active layer functions as an optical waveguide and has first and second edge faces for emitting light. The device further includes first and second light receiving sections for receiving light emitted from the first and second edge faces respectively and generating first and second pieces of optical information respectively and a control section for controlling the current injection amount into the active layer from the upper electrode according to the first and second pieces of optical information. The optical output and the spectral shape of the device can be easily, accurately and reliably controlled in a short period of time.

18 Claims, 11 Drawing Sheets

(51) Int. Cl.
*H01L 33/06* (2010.01)
*H01L 33/10* (2010.01)
*H01L 33/24* (2010.01)
*H01L 33/30* (2010.01)
*H01L 33/38* (2010.01)

(52) U.S. Cl.
CPC .............. *H01L 33/10* (2013.01); *H01L 33/24* (2013.01); *H01L 33/30* (2013.01); *H01L 33/38* (2013.01)

(56) References Cited

U.S. PATENT DOCUMENTS

| | | | |
|---|---|---|---|
| 9,269,853 B2 | 2/2016 | Suga et al. | |
| 9,316,531 B2 | 4/2016 | Suga et al. | |
| 2003/0147448 A1* | 8/2003 | Hayakawa | B82Y 20/00 |
| | | | 372/97 |
| 2006/0219877 A1* | 10/2006 | Kaluzhny | H01L 25/167 |
| | | | 250/226 |
| 2012/0327422 A1* | 12/2012 | Inao | H01L 27/15 |
| | | | 356/479 |
| 2013/0056621 A1* | 3/2013 | Suga | G01J 1/4257 |
| | | | 250/208.2 |
| 2013/0242310 A1* | 9/2013 | Matsuu | H01L 33/0045 |
| | | | 356/479 |
| 2014/0168656 A1 | 6/2014 | Suga | |
| 2014/0240714 A1* | 8/2014 | Matsuu | G01N 21/4795 |
| | | | 356/479 |
| 2017/0125629 A1* | 5/2017 | Uchida | H01L 33/0045 |

FOREIGN PATENT DOCUMENTS

| | | |
|---|---|---|
| JP | H4-345080 A | 12/1992 |
| JP | H6-53546 A | 2/1994 |
| JP | 2007-184557 A | 7/2007 |
| JP | 2011-66138 | 3/2011 |
| JP | 2011-66138 A | 3/2011 |
| JP | 2011-066138 A | 3/2011 |
| JP | 2014-120633 A | 6/2014 |

OTHER PUBLICATIONS

European Search Report dated Dec. 6, 2016 in corresponding European Application No. 16182186.3.
Chinese Office Action dated Jun. 27, 2018 during prosecution of related Chinese application No. 201610663632.5 (Whole English-language translation included.).
Chinese Office Action dated Feb. 26, 2019 during prosecution of related Chinese application No. 201610663632.5. (Whole English-language translation included.) (Note: All References listed in the CN OA have previously been cited in this case.).

* cited by examiner

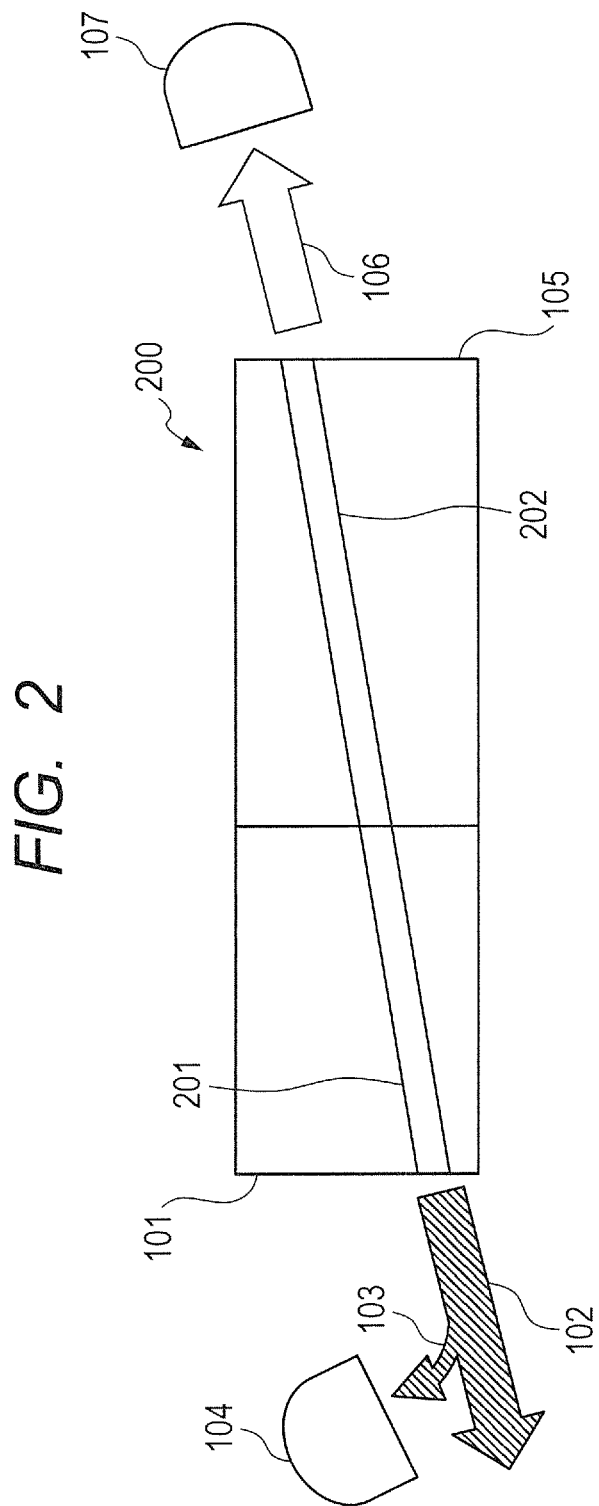

LIGHT EMITTING DEVICE CONTROLLING A CURRENT INJECTION AMOUNT INTO AN ELECTRODE ACCORDING TO PIECES OF OPTICAL INFORMATION

BACKGROUND OF THE INVENTION

Field of the Invention

The present invention relates to a semiconductor light emitting device. More particularly, this invention relates to a super-luminescent diode.

Description of the Related Art

Super-luminescent diodes (to be referred to as SLDs hereinafter) have been attracting attention in recent years.

That a semiconductor laser can be made to emit highly coherent light having a very narrow spectral half width with high output power by causing amplified stimulated emission light to resonate and also causing the emitted light to oscillate by means of a low injection current and that a light emitting diode (LED) can be made to emit light with a wide angle of radiation by utilizing spontaneous emission, are well known. Unlike those devices, SLDs are characterized in that they emit light having a broad spectral half width with high output power by using an arrangement of not causing the emitted light to resonate in a condition of high current injection, although they involve stimulated amplification.

Light that is stimulated and amplified so as not to resonate in a condition of high current injection in this way will be referred to as "SLD light" hereinafter in this letter of specification of this invention. Note that light emitted from the same region of an active layer includes both a spontaneous emission light component and an SLD light component.

The field of SLD applications has been expanding to include spectroscopes, length measuring devices, refractive index distribution measuring devices, tomography apparatus, excitation light sources and other instruments. For example, in the field of medical applications, devices referred to as optical coherence tomographic image measuring devices or optical coherence tomography apparatus (to be abbreviated as OCT apparatus hereinafter) are already known. OCT apparatus require a broadband and low coherent light source. More specifically, fundus examination OCT apparatus require a light source having a center wavelength of about 850 nm or 1,060 nm and representing an emission spectral shape that is close to Gaussian curve.

When an SLD is employed in a device of any of the above-described types and the optical output and the spectral shape thereof are to be controlled, conceivable techniques for exploiting SLD light for the intended purpose may include a technique of partly branching the SLD light to be used by means of an optical fiber or the like and a technique of receiving SLD light emitted from the light emitting surface thereof located opposite to the light emitting side of the SLD to be utilized for the intended purpose. Then, with either of the above-described techniques, the results obtained by analyzing the spectral distribution of the branched light or the received light are utilized to control the optical output and the spectral shape.

Specific exemplar techniques of controlling SLD light will now be described below by referring to FIGS. 3A and 3B. FIG. 3A schematically illustrates an arrangement for branching SLD light 806 emitted from an SLD device 805 having a single ridge type upper electrode for current injection, namely an SLD device having a single electrode structure, by means of a branching mirror 802. Note that FIG. 3A illustrates a plan view of the SLD device 805 as viewed from the side of the upper electrode 801.

The emitted SLD light 806 is divided by the branching mirror 802 into SLD light 803 to be used for the intended purpose and SLD light 804 to be entered into a detector 811. The arrangement is also so designed as to adjust the electric current being injected into the upper electrode 801 according to the detection signal generated by the detector 811. Thus, as a result of this arrangement, the optical output and the spectral shape of the SLD device 805, among others, are controlled.

FIG. 3B, on the other hand, schematically illustrates an arrangement for detecting SLD light 807 emitted from the edge face opposite to the light emitting side of the SLD device for emitting SLD light 806 to be used for the intended purpose by means of a detector 812 and adjusting the current injection amount into the upper electrode 801 according to the detection signal generated by the detector 812. Thus, as a result this arrangement, the optical output and the spectral shape of the SLD device, among others, are controlled.

Apart from the arrangements illustrated in FIGS. 3A and 3B, Japanese Patent Application Laid-Open No. 2011-66138 (to be referred to as Patent Literature 1 hereinafter) describes an arrangement for monitoring the reflected light from an edge face of an SLD device and adjusting the electric current being injected into the electrode of the SLD device according to the monitored value. Additionally, Japanese Patent Application Laid-Open No. H06-53546 (to be referred to as Patent Literature 2 hereinafter) describes an arrangement for monitoring the output of an SLD device from the second region thereof and adjusting the electric current being injected into the first region according to the monitored value.

However, while not only the optical output but also the spectral shape need to be controlled for SLDs that are required to represent spectral characteristics including a broadband spectrum and a spectral shape that is close to Gaussian curve, no conventional technique can control both of them in a simple and easy manner.

For example, as a conceivable technique for checking the spectral shape of an SLD device, the SLD light emitted from the device may be branched in a manner as illustrated in FIG. 3A and the branched light may be measured by means of an optical spectrum analyzer. However, such a technique is accompanied by a problem of requiring the use of a bulky arrangement, which entails high cost and inevitably reduces the optical output that can be used for the intended purpose.

Furthermore, in the case of techniques of detecting (the optical output of) light emitted from only either one of the edge faces of an SLD such as the techniques illustrated in FIGS. 3A and 3B and those described in Patent Literatures 1 and 2, information that is detectable by any of those techniques is only the optical output of SLD light unless an optical spectrum analyzer or a similar instrument is additionally employed. In other words, with any of those techniques, information that accurately reflects changes in the beam characteristics of SLD light can hardly be obtained.

Particularly, when light emitted from the first edge face and light emitted from the second edge face of an SLD represent different beam characteristics and the emitted light monitoring arrangement is designed to monitor only light emitted from either of the edge faces, the optical output and the spectral shape cannot be controlled simply by adjusting the current injection amount unless the relationship between the beam characteristics of the light emitted from the first edge face and those of the light emitted from the second edge face is predetermined and known in advance. Additionally, when more than one electrodes are provided for current injection, there arises a problem of obtaining information necessary for individually controlling the injection current of each of the electrodes.

Note that the expression of the beam characteristics of emitted light as used herein includes the mean value or the change with time of the output power of light emitted from an SLD (SLD light in particular), the spectrum, the radiation angle and the polarization direction.

In order to obtain a broadband spectral shape for SLD light, for example, both light emitted from the ground level and light emitted from excited levels of the active layer may sometimes be employed in combination. An SLD having such a feature will be described below by referring to FIG. 6.

Referring to FIG. 6, the horizontal axis indicates the wavelength and the vertical axis indicates the amount of light. The plurality of curves drawn in FIG. 6 represents different carrier injection densities. The overall amount of light is small when the injection density is low but the overall amount of light tends to increase as the injection density rises. FIG. 6 also illustrates that the spectral shape changes to a large extent as a function of injection density and that an increase in the amount of light is observable as a function of increase of the injection density particularly at the short wavelength band side.

In FIG. 6, the straight line 1001 indicates the wavelength of light emitted from the ground level and the dotted line 1002 indicates the wavelength of light emitted from an excited level.

As the current injection amount is increased, the intensity of light emitted from the ground level increases in a low current injection range but the growth of the intensity of light emitted from the ground level becomes low, whereas the intensity of light emitted from an excited level begins to grow remarkably in a high current injection range.

Thus, changes in the spectral shape can hardly be grasped if only the overall optical output is monitored. In view of the above-identified problem of the prior art, therefore the object of the present invention is to provide an arrangement for a light emitting device, which may particularly be an SLD that is required to represent a broadband spectral shape, that enables the optical output and the spectral shape thereof to be easily, accurately and reliably controlled in a short period of time, a method of controlling an SLD having such an arrangement and also an optical coherence tomography apparatus using such an SLD.

SUMMARY OF THE INVENTION

In an aspect of the present invention, there is provided a light emitting device including: an optical waveguide layer formed by sequentially laying a lower clad layer, an active layer and an upper clad layer on a substrate having a lower electrode; and an upper electrode for injecting carriers into the active layer; the optical waveguide layer having first and second edge faces operating as light emitting surfaces; light emitted from the first edge face representing beam characteristics different from the beam characteristics of light emitted from the second edge face; the light emitting device further including: a first light receiving section for receiving at least part of the optical power of the light emitted from the first edge face and generating a first piece of optical information; a second light receiving section for receiving at least part of the optical power of the light emitted from the second edge face and generating a second piece of optical information; and a control section for controlling the current injection amount into the upper electrode according to the first and second pieces of optical information.

In another aspect of the present invention, there is provided a method of controlling a light emitting device as defined above including execution by the control section of: a step of adjusting the value of the current injection into the upper electrode so as to confine a specific value in the first piece of optical information as defined above within a predefined range; a step of determining a specific value in the second piece of optical information as defined above as being confined within a predetermined range or not; and a step of outputting a signal in case of determining the specific value in the second piece of optical information as not being confined within the predetermined range.

In still another aspect of the present invention, there is provided an optical coherence tomography apparatus using a light emitting device as defined above, the apparatus including: a specimen measuring section for irradiating (a major part of) the light emitted from the light emitting device onto a specimen and transmitting the light reflected from the specimen; a reference section for irradiating (the rest of) the light emitted from the light emitting device onto a reference mirror and transmitting the light reflected from the reference mirror; an interference section for causing the light waves transmitted by the specimen measuring section and reflected from the specimen and the light waves transmitted by the reference section and reflected from the reference mirror to interfere with each other; a light detecting section for detecting the interfering light waves generated by the interference section; and an image processing section for obtaining a tomographic image of the specimen according to the light waves detected by the light detecting section.

Further features of the present invention will become apparent from the following description of exemplary embodiments with reference to the attached drawings.

BRIEF DESCRIPTION OF THE DRAWINGS

FIG. 2 is a schematic illustration of Example 1.

DESCRIPTION OF THE EMBODIMENTS

Preferred embodiments of the present invention will now be described in detail in accordance with the accompanying drawings.

Figure 1A:
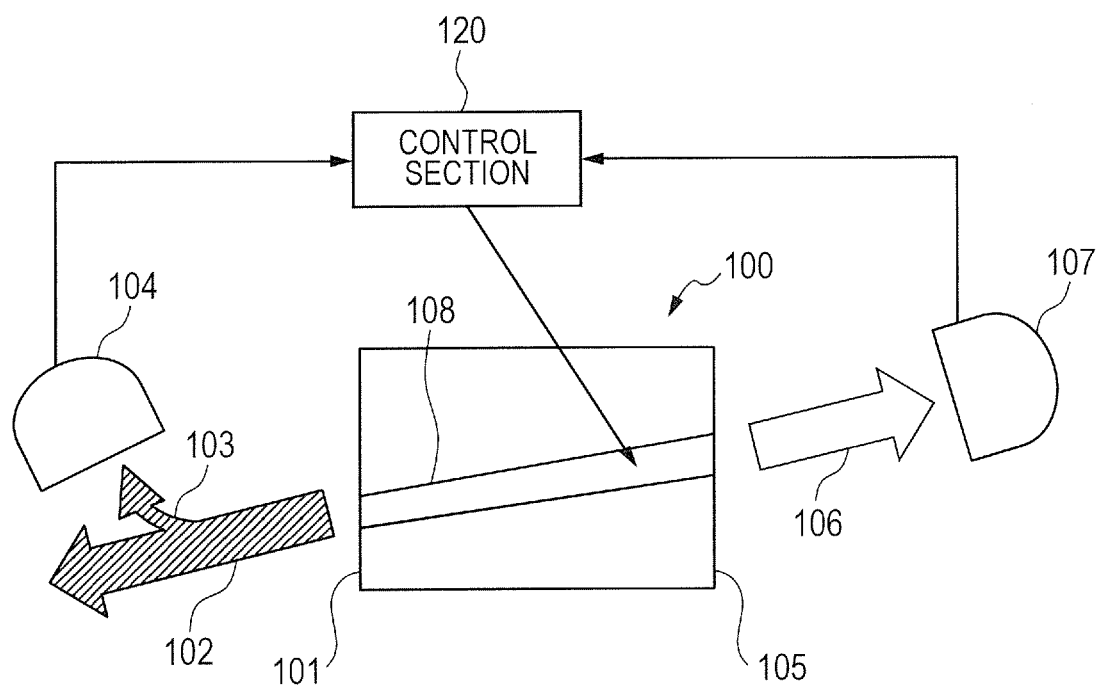
FIGS. 1A and 1B are schematic illustrations according to an embodiment of the present invention.
Figure 1B:
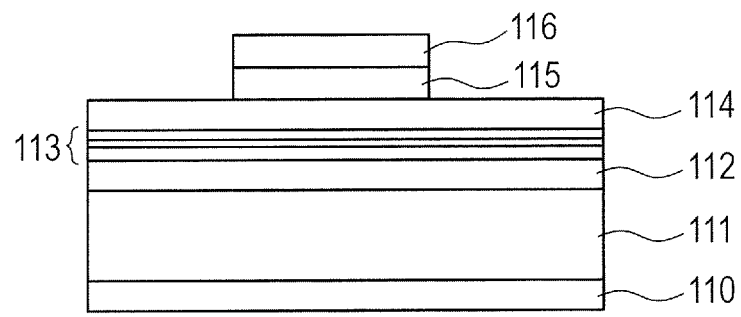
Figure 3A:
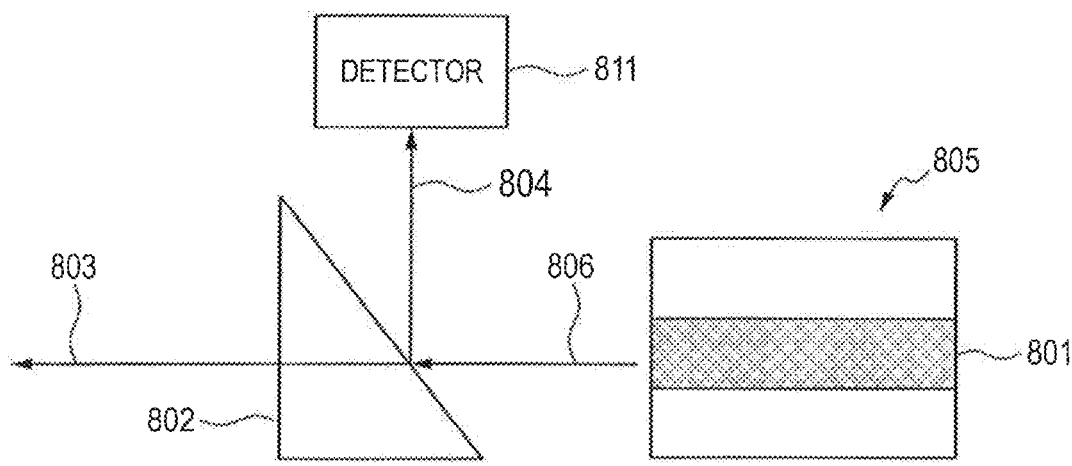
FIGS. 3A and 3B are schematic illustrations of exemplar methods of monitoring the light emitted from an SLD.
Figure 3B:
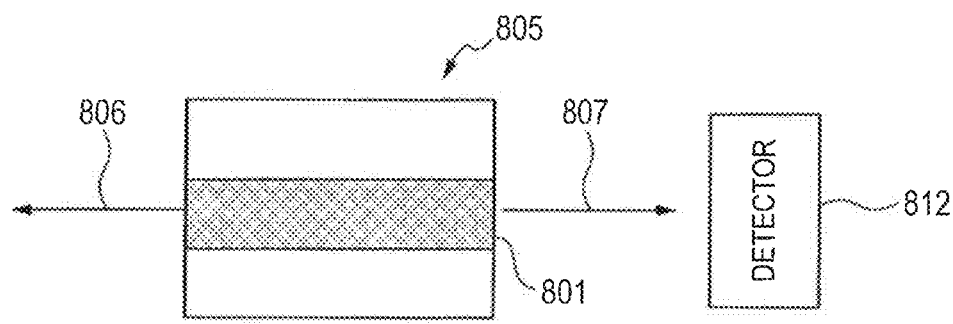

FIGS. 1A and 1B are schematic illustrations of an embodiment of the present invention. FIG. 1A is a schematic illustration of the conceptual arrangement for controlling the optical output and the spectral shape of an SLD, which is a light emitting device according to an embodiment of the present invention. FIG. 1A illustrates a top view of the SLD 100. FIG. 1B a schematic cross-sectional view of the SLD of this embodiment, representing the structure thereof.

As seen from FIG. 1A, a ridge section 108 is formed on the SLD 100. The ridge section 108 is formed such that the angle thereof relative to the first edge face 101 of the SLD 100, which is the major light emitting surface for light generated in the active layer 113, and also to the second edge face 105 located oppositely relative to the first edge face is selected to minimize the reflectance of light propagating through the optical waveguide (the ridge waveguide) formed in a region running along the ridge section in the tabular active layer arranged under the ridge section (the angle being, for example, around 7°). Incidentally, the first edge face 101 and the second edge face 105 are referred to generically as light emitting surfaces. Additionally, as illustrated in FIG. 1B, an upper electrode 116 is formed in the uppermost layer of the ridge section 108, so as to inject electric current into the active layer 113, while a lower electrode 110 is formed on the bottom face of the substrate 111 of the SLD 100.

FIG. 1B is an exemplar cross-sectional view of the SLD 100, illustrating the internal structure thereof. FIG. 1B is obtained by cutting the SLD 100 from the top down to the bottom of the SLD 100 illustrated in FIG. 1A. The structure of the SLD 100 is obtained by sequentially laying the lower electrode 110, the substrate 111, a clad layer 112 of the first conductivity type, the active layer 113, a clad layer 114 of the second conductivity type representing a polarity different from the first conductivity type, a contact layer 115 and the upper electrode 116 in the above-mentioned order from below. While the contact layer 115 and the upper electrode 116 form a ridge structure in FIG. 1B, the present invention is by no means limited to such an arrangement. For example, a ridge structure may alternatively be formed by etching from the upper electrode 116 partway down to the lower surface of the clad layer 114 of the second conductivity type, down to the lower surface of the active layer 113 or partway down to the lower surface of the clad layer 112 of the first conductivity type. In the case of an optical waveguide that allows mode control, the use of a ridge type optical waveguide is not absolutely necessary and a buried type optical waveguide may alternatively be employed.

A method of controlling the injection current into an SLD having a structure as illustrated in FIG. 1B will now be described below by referring to FIG. 1A. SLD light 102 is emitted from the first edge face 101 of the ridge waveguide, which is a partial region of the active layer 113. A first light receiving section 104 measures the optical intensity of the branched part 103 of SLD light 102.

At the same time, SLD light 106 representing beam characteristics different from those of SLD light 102 is emitted from the second edge face 105 of the ridge waveguide. At least part of SLD light 106 enters a second light receiving section 107, which measures the optical intensity thereof. While the two light receiving sections are arranged apart from the main body of the SLD 100 in FIG. 1A, the present invention is by no means limited to such an arrangement. In other words, alternatively, the two light receiving sections may integrally be formed with the SLD section as monolithic entity.

The optical information that is generated according to the measured optical intensities is transmitted to control section 120, which controls the current injection amount into the SLD 100 according to the optical information generated at the first light receiving section 104 (the first piece of optical information) and the optical information generated at the second light receiving section 107 (the second piece of optical information).

Instances where light (SLD light) emitted from the first edge face represents beam characteristics that are different from those of light (SLD light) emitted from the second edge face include those where the ridge width and the width of the first electrode are or the thickness of the clad layer is not constant over the entire surface of the SLD, those where the ridge structure is not constant as viewed in cross section, those where the active layer is not uniform (e.g., the active layer is not uniform in terms of thickness or chemical composition or the active layer is differentiated between at the side of the first edge face and at the side of the second edge face), those where the ridge section has a branched part, those where the edge faces have a filter, those where the active layer has a wavelength converting region, those where the upper electrode is divided into a plurality of parts and those where the current injecting condition is not uniform.

Now, the beam characteristics of emitted light (rigorously speaking SLD light) will be described below particularly by paying attention to the spectral shape and the optical output. Note that, while emitted light of this embodiment and that of each of Examples contains not only an SLD light component but also a spontaneous emission light component, the spontaneous emission light component will be disregarded in the following description because the content ratio of the spontaneous emission light component is small. No significant problem arises if the spontaneous emission light component is disregarded. However, as evidence of being conscious of the existence of the spontaneous emission light component, emitted light will be referred not to as SLD light but simply to as light or light beam unless only SLD light is to be discussed.

With the arrangement of this embodiment, the wavelength composition (e.g., the center wavelength) that constitutes a principal factor of light detected at the first light receiving section differs from the wavelength composition that constitutes a principal factor of light detected at the second light receiving section. Therefore, not only the optical output but also the spectral shape of SLD light can be controlled by adjusting the current injection amount into the upper electrode according to the optical information generated at the first light receiving section 104 and the optical information generated at the second light receiving section 107 by means of a simple and less expensive arrangement.

For the purpose of the present invention, provision of an emission spectrum modulation region in the optical waveguide layer is effective as means for differentiating the beam characteristics of the light emitted from the first edge face and the beam characteristics of the light emitted from the second edge face. An emission spectrum modulation region refers to a region that is arranged in the ridge waveguide and free from any current injection or subjected to a reverse bias voltage. As a light beam passes through such a region, the wavelength composition factor of the light beam changes.

Example 1

In Example 1, the ridge waveguide of the SLD of this example is made to include a light emitting region and an emission spectrum modulation region. This will be described below by referring to FIG. 2. Note that the components of this example that are functionally the same as or similar to those illustrated in FIG. 1A are respectively denoted by the same reference symbols.

The SLD 200 of this example has a light emitting region (current injection region) 201 and an emission spectrum modulation region 202 in the ridge waveguide thereof. The SLD 200 of this example has the light emitting region 201 at the side of the first edge face 101 and the emission spectrum modulation region 202 at the side of the second edge face 105.

The emission spectrum modulation region 202 is a region that modulates the optical spectrum by partly absorbing the optical spectrum. While this region may be made to be free from the upper electrode, if a reverse bias voltage is to be applied to the region in order to amplify the modulation, an electrode for this purpose needs to be provided. While the electrode for applying a reverse bias voltage may have a cross-sectional profile same as that of the upper electrode for injecting an electric current into the active layer, the cross-sectional profiles of these two electrodes may not necessary be same.

As an electric current is injected into the light emitting region (current injection region) 201 from the upper electrode, the region of the active layer that corresponds to the current injection region 201 emits light and produces a light beam 102. This active layer region emits light not only in the direction heading for the first edge face 101 but also in the direction heading for the second edge face 105. As the latter light, or the light heading for the second edge face 105, passes through the emission spectrum modulation region 202, a short wavelength side part of the optical spectrum is absorbed so as to become light 106 representing optical beam characteristics (spectral shape) different from those of the light beam 102 and then the light 106 is emitted from the second edge face 105.

The structure of the SLD 200 of this example as viewed in cross section is similar to the one illustrated in FIG. 1B. An n-type doped GaAs substrate is employed for the substrate 111. Then, an n-type doped $Al_{0.5}GaAs$ layer, an multiple quantum well structure having a GaAs layer and a $GaIn_{0.066}As$ layer operating in combination as quantum well layer and an $Al_{0.2}GaAs$ layer operating as barrier layer, a p-type doped $Al_{0.5}GaAs$ layer and a p-type doped GaAs layer are formed respectively for a lower clad layer 112, an active layer 113, an upper clad layer 114 and a contact layer 115. As seen from the band structure illustrated in FIG. 5, the multiple quantum well structure that constitutes the active layer 113 includes a single 6 nm-thick GaAs quantum well layer and a pair of 8 nm-thick $GaIn_{0.066}As$ quantum well layers, each of which is formed so as to be sandwiched between $Al_{0.2}GaAs$ barrier layers.

Figure 5:
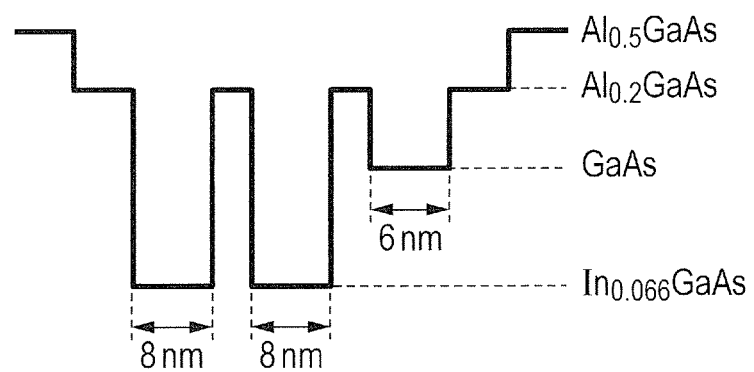
FIG. 5 is a schematic illustration of the band structure of the multiple quantum well that forms the active layer of the SLD of Example 1.

As illustrated in FIG. 5, while two of the three quantum well layers that constitute the active layer of this example are equal quantum wells, the third one differs from the former two quantum wells in terms of composition and thickness of well layer. A multiple quantum well including well layers that are different in terms of composition and thickness as described above is referred to as asymmetric quantum well to discriminate it from a symmetric quantum well that includes only quantum wells all of which are equal to each other in terms of composition and thickness. The emission spectrum of an asymmetric quantum well structure is known to change remarkably as a function of the carrier density thereof. Therefore, the active layer can be made to emit broadband light by appropriately selecting the composition and the thickness of each of the quantum well layers.

Figure 7A:
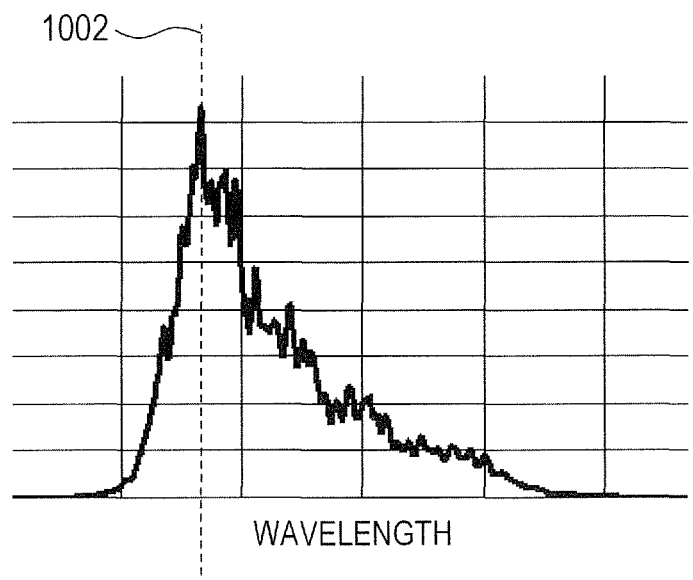
FIGS. 7A and 7B are graphs illustrating the spectral intensity distribution of light emitted from the first edge face and that of light emitted from the second edge face of the SLD of Example 1.
Figure 7B:
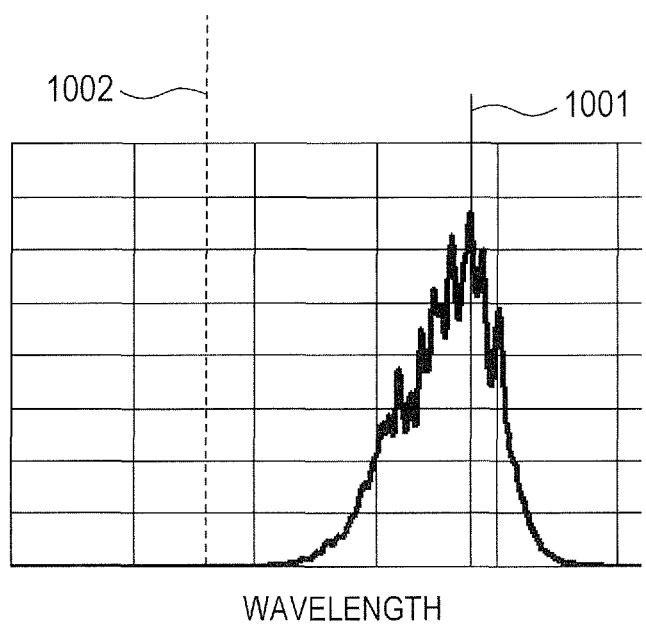

FIGS. 7A and 7B illustrate some of the spectrum data obtained by observing light emitted from the first edge face 101 and light emitted from the second edge face 105 of the SLD 200 of this example by means of an optical spectrum analyzer.

FIG. 7A schematically illustrates the spectral intensity distribution of light emitted from the first edge face 101 when an electric current of 184 mA is injected into the light emitting region 201 having a width of 3.0 μm and a length of 0.3 mm.

FIG. 7B schematically illustrates the spectral intensity distribution of light emitted from the second edge face 105 when an electric current is injected into the light emitting region 201 under the conditions same as those used to obtain the results of FIG. 7A. The length of the emission spectrum modulation region 202 of this instance is 0.3 mm.

As seen from FIGS. 7A and 7B, an amount of light whose wavelength distribution spreads over a broad wavelength range and that includes light components of short wavelengths is detected from light emitted from the first edge face 101, whereas light components of short wavelengths are mainly absorbed from light emitted from the second edge face 105 when the emitted light passes through the emission spectrum modulation region 202 so that an amount of light whose wavelength distribution is lopsided to the long wavelength side is detected from light emitted from the second edge face 105.

Thus, with the arrangement of providing the SLD 200 with two light receiving sections, one at the front side of the SLD 200 and the other at the back side of the SLD 200, as illustrated in FIG. 2, the first light receiving section 104 can detect emitted light that contains all the optical components including short wavelength components while the second light receiving section 107 practically detects only long wavelength components.

As described above by referring to FIG. 6, with an SLD having characteristics that causes the spectrum shape to change as a function of the injected current, the change in the spectral shape cannot be grasped simply by monitoring all the amount of emitted light. Particularly, in a condition of a high current injection, the amount of light of short wavelength components, which is light from excited levels, increases rapidly to make it difficult to grasp the change in the amount of light of long wavelength components, which is light from the ground level. To the contrary, the SLD of this example has an arrangement that facilitates detection of changes in the amount of light of long wavelength components at the second light receiving section 107.

In the instance of this example, while the SLD 200 is being driven, light emitted from the first light receiving section 104 and light emitted from the second light receiving section 107 are monitored separately and the control section (not illustrated) controls the current injection amount into the light emitting region (current injection region) 201 according to the data obtained by the monitoring.

In this example, a part of light 103 of the light beam 102 emitted from the first edge face 101 that is branched by an optical fiber is made to enter the first light receiving section 104 arranged at an end of the optical fiber. The part of light 103 differs from the light beam 102 prior to the branching only in terms of quantity of light and practically all the remaining beam characteristics thereof are the same as those of the beam of light 102 prior to the branching. Therefore, the conditions of the beam of light 102 can be grasped by seeing the value data obtained from the part of light 103.

As the first light receiving section 104 receives the part of light 103, it generates a detection signal that reflects the optical power of the received light as the first piece of optical information and outputs the signal. With regard to the output of the first piece of optical information from the first light receiving section 104, assume that the initial value of the detection signal is A and the permissible range of the signal is ±α. When, the value of the detection signal output from the first light receiving section 104 is found to be out of the range of A±α, the current injection amount into the electrode is adjusted so as to make the detection signal value to be confined within the range of A±α.

If, on the other hand, the value of the detection signal output from the first light receiving section 104 is within the range of A±α but the value B of the detection signal output from the second light receiving section 107 as the second piece of optical information goes out of the permissible range of B±β, the supply of electric power to the light source needs to be suspended or a warning signal needs to be output.

Thus, with the arrangement of adjusting the current injection amount not only according to the first piece of optical information output from the first light receiving section 104 but also according to the second piece of optical information output from the second light receiving section 107, not only the optical output of light emitted from the SLD 200 but also the spectral shape of emitted light are taken into consideration as materials for determining the operation of adjusting the current injection into the SLD 200.

Example 2

Now, Example 2 will be described below by referring to FIG. 4, The SLD of this example has two light emitting regions in the ridge waveguide.

Figure 4:
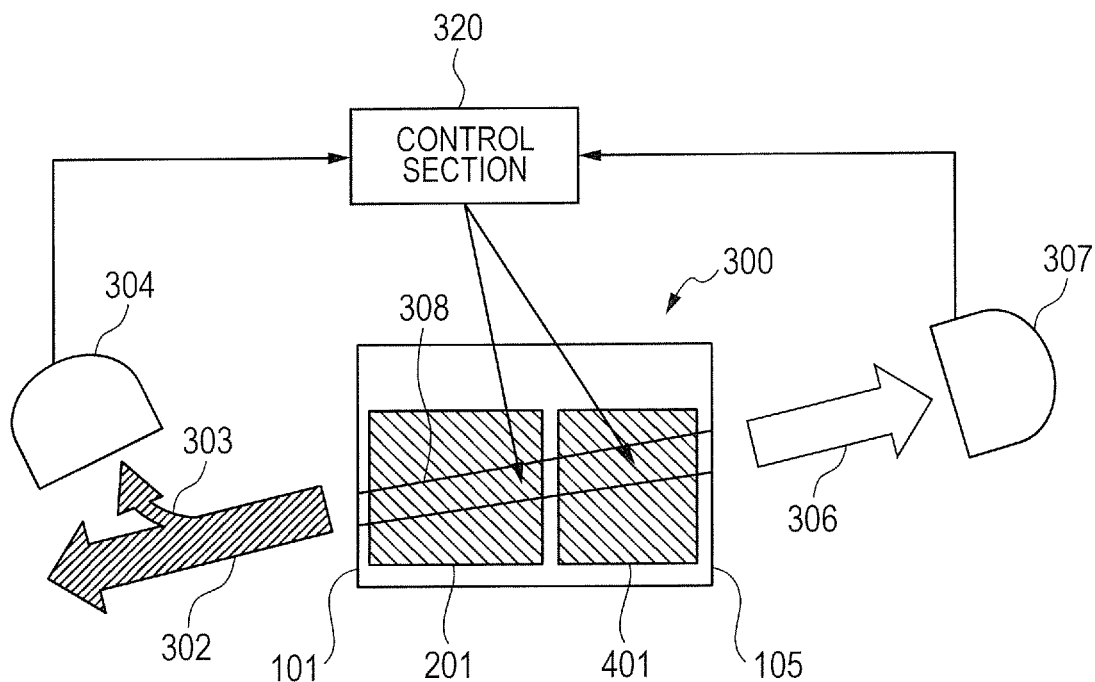
FIG. 4 is a schematic illustration of Example 2.

Note that the components illustrated in FIG. 4 that are functionally the same as the corresponding respective components illustrated in FIG. 1A are denoted by the same reference symbols.

The SLD 300 of this example has a first light emitting region 201 and a second light emitting region 401 that are arranged along the ridge waveguide 308. The first light emitting region 201 is located at the side of the first edge face 101, whereas the second light emitting region 401 is located at the side of the second edge face 105.

The above-described arrangement can obtain an emission spectrum over a broader wavelength band if compared with the SLD of Example 1 illustrated in FIG. 2.

Now, this example will be described below in detail.

Figure 8A:
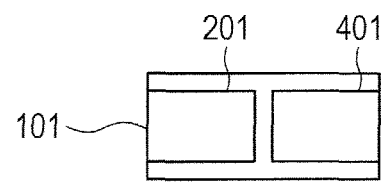
FIG. 8A is a schematic illustration of the waveguide structure of the SLD of Example 2 and FIG. 8B is a graph illustrating the spectral intensity distribution of light emitted from the first edge face of the SLD of Example 2.
Figure 8B:
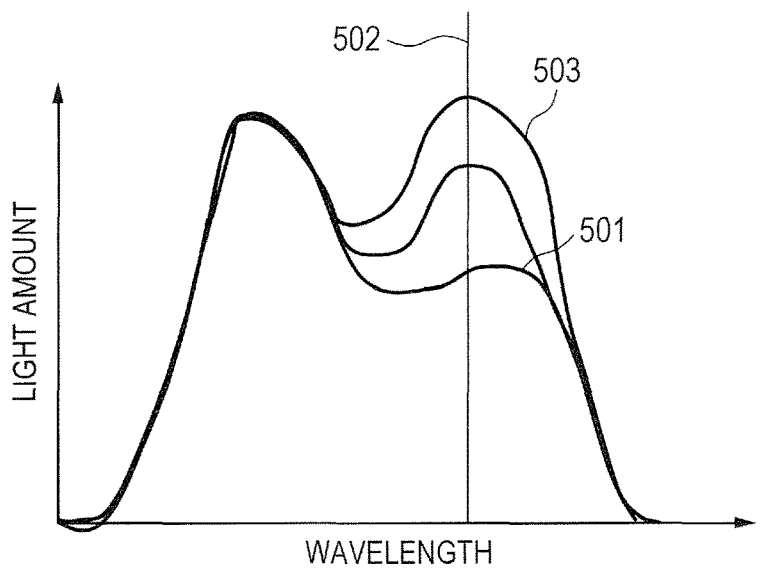

Firstly, the emission spectrum that can be obtained by injecting an electric current into the first light emitting region 201 and the second light emitting region 401 will be described by referring to FIGS. 8A and 8B. FIG. 8A is a simplified schematic illustration of the ridge waveguide section of the SLD 300 of this example illustrated in FIG. 4. FIG. 8B is a graph illustrating the spectral intensity distribution of the light emitted from the first edge face 101 of an SLD having an active layer and an electrode that are arranged in a manner similar to those of the SLD 300 of this example, which spectral intensity distribution changes as a function of the current injection amount.

Figure 6:
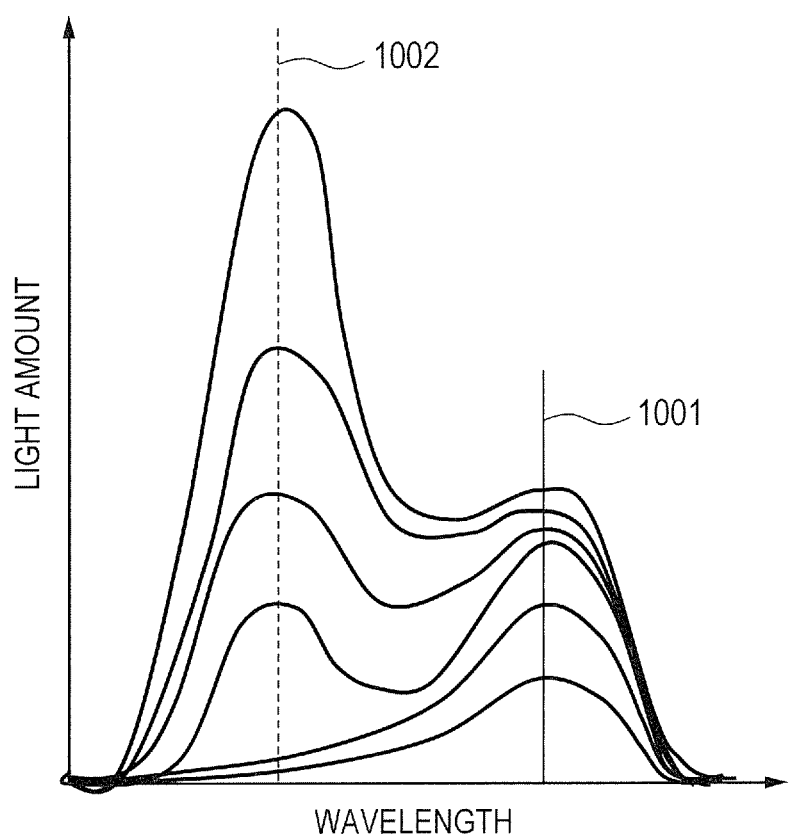
FIG. 6 is a graph illustrating changes in the spectral shape of light emitted from an SLD that utilizes light emission from the ground level and light emission from an excited level.

Firstly, as an electric current is injected into the electrode that corresponds to the first light emitting region 201, the corresponding region of the active layer generates light, which is then emitted from the first edge face 101. As illustrated in FIG. 6, as the current injection amount increases, the intensity of light emission from excited levels and containing short wavelength components is raised. The curve 501 in FIG. 8B illustrates this condition. As an electric current is injected into the second light emitting region 401 in this condition, long wavelength components that correspond to light emission from the ground level are added thereto as indicated by the straight line 502 in FIG. 8B.

Thus, the SLD of this example behaves quite differently if compared with an instance where carriers are injected only into the first electrode (first light emitting region) and can realize a high power output over a broadband. The principle underlying this behavior will be briefly described below.

As carriers are injected into the first electrode to realize a highly excited condition, carriers are trapped not only at the ground level but also at higher levels and light is emitted as a result of carrier recombination. Then, as the emitted light is guided through the optical waveguide, optical amplification takes place due to stimulated emissions.

As carriers are injected into the second electrode to realize a lowly excited condition, on the other hand, carriers are trapped only at the ground level and the emitted light is guided through the optical waveguide of the second light emitting region. However, no great optical amplification takes place because the excitation density is low.

As the light guided through the second light emitting region gets to the first light emitting region, optical amplification takes place rapidly. This is because most of the injected carriers are consumed for stimulated emissions from higher levels while most of the carriers trapped at the ground level are consumed for spontaneous emissions in the first light emitting region and, therefore, as the light from the second light emitting region, which corresponds to light emission from the ground level, is guided, stimulated emissions from the ground level becomes remarkable. FIG. 8B plainly illustrates such a situation.

The intensity of light emission from excited levels can be made to be substantially equal to the intensity of light emission from the ground level as indicated by the curve 503 by adjusting the current injection amount into the second light emitting region 401. An emission spectrum of a broader band can be obtained with a higher output level if compared with an instance of injecting an electric current only into the first light emitting region 201. As an example, an electric current of 123.3 mA was injected into a 0.33 mm-long first electrode and an electric current of 6.4 mA was injected into a 0.30 mm-long second electrode. Then, the spectral half width of the emitted light was 85 nm and an optical output of 8.2 mW was obtained.

Thus, in the SLD of this example, the light emitted from the first edge face is constituted by contributions from a plurality of light emitting regions as described above. Therefore, a feedback technique that is different from any comparable conventional techniques is required to control the current injection amount to each of the light emitting regions for the purpose of correcting the changes that may occur in the beam characteristics due to changes in the environment and also changes with time.

Now, the feedback technique to be used for the SLD of this example will be described below.

The structure of the SLD 300 of this example in cross section is similar to that of the SLD 200 of Example 1. While the SLD 300 is being driven, the output (detected specific values, optical information) of the first light receiving section 304 and that of the second light receiving section 307 are monitored separately and the control section 320 controls the current injection amount into the first current injection region 201 and also the current injection amount into the second current injection region 401.

Figure 13:
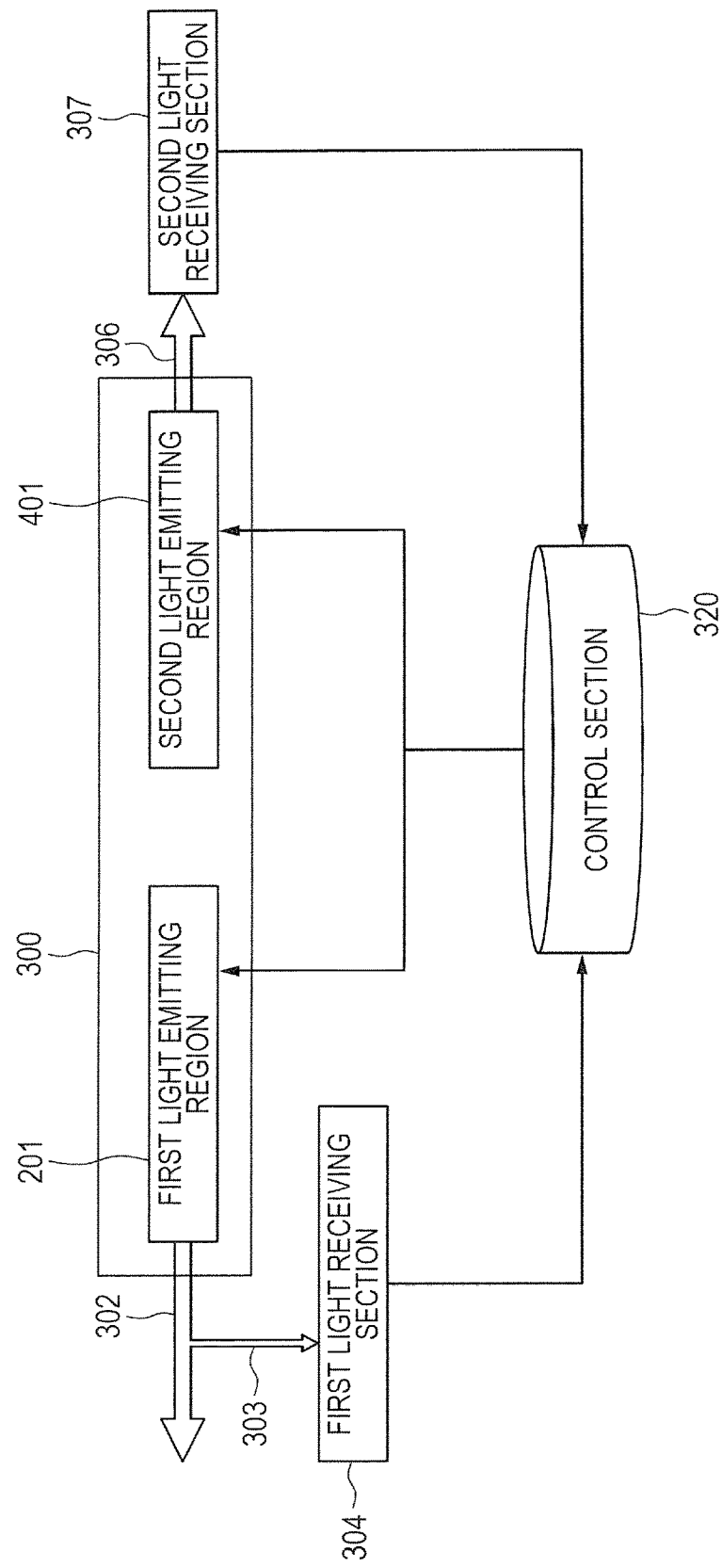
FIG. 13 is a schematic illustration of the SLD control method of Example 2.

The technique of controlling the current injection amount will be described in greater detail below by referring to FIG. 13.

The branched part 303 of light 302 emitted from the side of the first edge face 101 of the SLD 300 is made to enter the first light receiving section 304.

Assume here that the initial value of the output from the first light receiving section 304 is A and the permissible range of the output is $\pm\alpha$. When the value of the output from the first light receiving section 304 is found to be out of the range of A$\pm\alpha$, the current injection amount into the first light emitting region 201 is adjusted so as to make the value to be confined within the range of A$\pm\alpha$.

As described above, the amount of light 303 that enters the first light receiving section 304 depends mainly on the current injection amount into the first light emitting region 201 to a large extent. Therefore, the overall light emission of the SLD can be held substantially to a constant level by adjusting the current injection amount into the first light emitting region 201 according to the output value of the first light receiving section 304.

However, as described above, the light emitting region or regions other than the first light emitting region 201 (the second light emitting region 401 in this instance) contribute to changes in the optical spectral half width to a large extent and hence the adjustment of the conditions of light emission of the SLD 300 require the following control operation.

The light 306 emitted from the side of the second edge face 105 of the SLD 300 is made to enter the second light receiving section 307. Assume here that the initial value of the output from the second light receiving section 307 is B and the permissible range of the output is $\pm\beta$. When, the value of the output from the second light receiving section 307 is found to be out of the range of B$\pm\beta$, the current injection amount into the second light emitting region 401 is adjusted so as to make the value to be confined within the range of B$\pm\beta$.

Note that that the adjustment of the current injection value into the first light emitting region 201 and the adjustment of the current injection value into the second light emitting region 401 are conducted not simultaneously but alternately. While the current injection value into one of the light emitting regions is being adjusted, the current injection value of the other light emitting region is held to be constant.

The operation of controlling the current injection values is repeated until the output values from the two light receiving sections are found within the respective predefined ranges. If at least either of the two output values cannot ultimately be confined within the related predefined range, either the power supply to the light source is suspended or a warning signal is output.

As the control section 320 executes the above-described steps, the current injection into the SLD 300 can be adjusted by observing not only the optical output but also the spectral shape as data to be taken into consideration for determining the control operation.

Example 3

The SLD of Example 3 has a plurality of light emitting regions and an emission spectrum modulation region in the ridge waveguide section thereof. This will be described below by referring to FIGS. 12A and 12B.

The SLD of this example will be described in terms of a ridge waveguide section having three light emitting regions and an emission spectrum modulation region, although the present invention is by no means limited to such a specific arrangement. In other words, when there are two or more than two light emitting regions, the operation of current injection can be controlled just as in the case of this example. For example, the description of current injection control of this example given below is also applicable to instances where there are two light emitting regions and there is no emission spectrum modulation region (as in the case of Example 2), instances where there are two light emitting regions and a single emission spectrum modulation region and instances where there are an even greater number of light emitting regions.

Figure 12A:
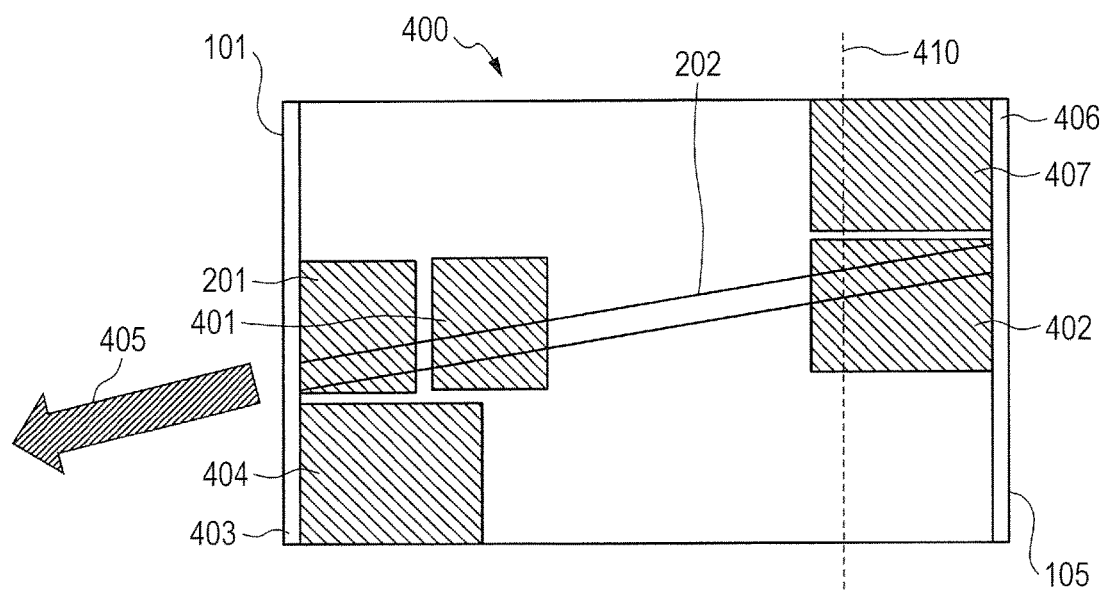
FIG. 12A is a schematic illustration of the waveguide structure of the SLD of Example 3 and FIG. 12B is a cross-sectional view of the SLD of Example 3, representing the structure thereof.
Figure 12B:
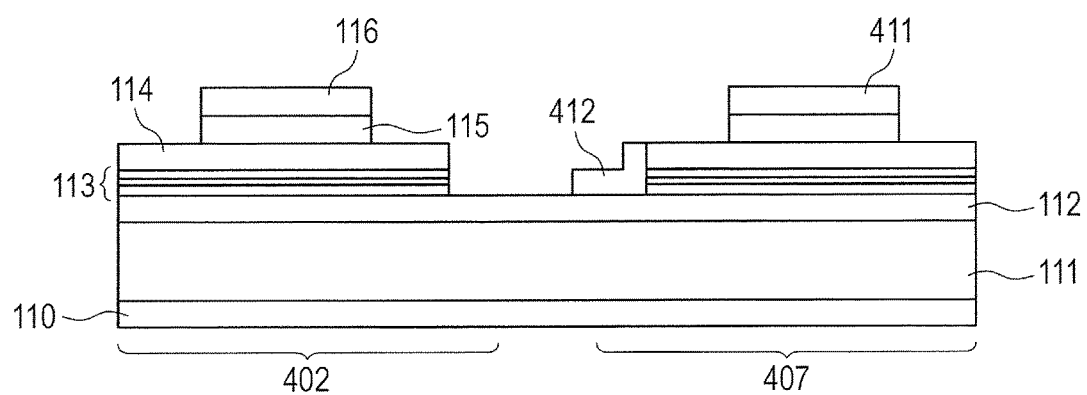

Note that, in FIGS. 12A and 12B, the parts having respective functions similar to those of FIGS. 1A and 1B, FIGS. 2 and 4 are denoted by the same reference symbols.

As illustrated in FIGS. 12A and 12B, the SLD 400 of this example has a first light emitting region 201, a second light emitting region 401, an emission spectrum modulation region 202 and a third light emitting region 402. The first light emitting region 201 is located at the side of the first edge face 101 and the third light emitting region 402 is located at the side of the second edge face 105.

With the above-described arrangement, the SLD of this example can provide an emission spectrum over a broader band if compared with Example 1 and Example 2.

Since the emission spectrum that is obtained when an electric current is injected into the first light emitting region 201 and also into the second light emitting region 401 is the same as the one described in Example 2, the description of such an emission spectrum will be omitted here.

The emission spectrum modulation region 202 is a region where the optical spectrum is modulated by partly absorbing the optical spectrum. While the upper electrode may be omitted, an electrode will be required when a reverse bias voltage is to be applied in order to boost the modulation. While the cross section of such an electrode may be the same as that of the upper electrode for applying an electric current into the active layer, the two cross sections may not necessarily be the same.

Unlike the arrangement of Example 1, the third light emitting region 402 is additionally provided in this example at the side of the second edge face 105 relative to the emission spectrum modulation region 202.

With such an arrangement, the emission spectrum can be made to have even a further broader band. This will be described in detail by referring to FIGS. 9A and 9B.

Figure 9A:
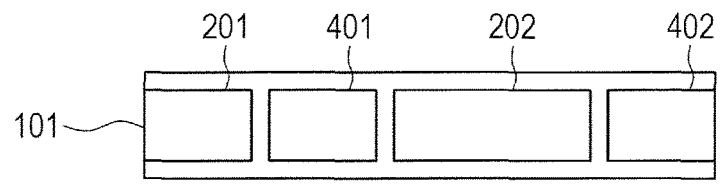
FIG. 9A is a schematic illustration of the waveguide structure of the SLD of Example 3 and FIG. 9B is a graph illustrating the spectral intensity distribution of light emitted from the first edge face of the SLD of Example 3.
Figure 9B:
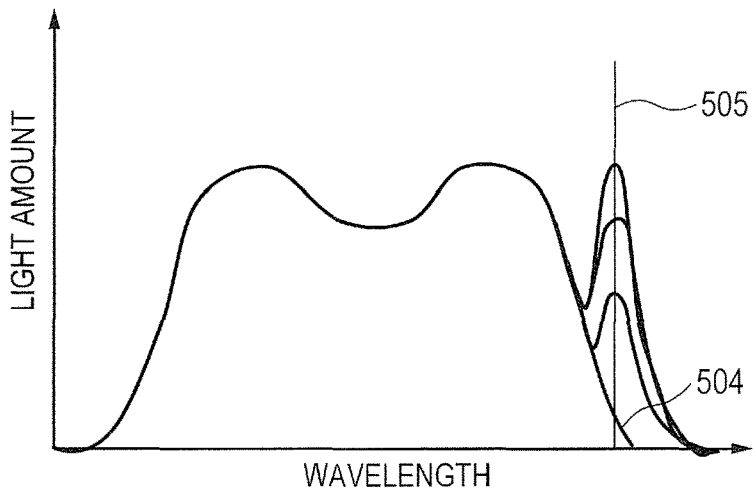

FIG. 9A is a simplified schematic illustration of the ridge waveguide section illustrated in FIG. 12A. The curved line 504 in FIG. 9B indicates the emission spectrum that is obtained in a condition similar to the one in which the curved line 503 of FIG. 8B is obtained. In other words, FIG. 9B illustrates a condition where a high electric current is injected into the first light emitting region 201 and a low electric current is injected into the second light emitting region 401.

As another electric current is additionally injected into the third light emitting region 402 in this condition until a condition where a high current has been injected is realized, long wavelength components that are centered at the wavelength indicated by the straight line 505 are increased in the optical spectrum. This phenomenon occurs because, as the light generated from the third light emitting region 402 is guided through the emission spectrum modulation region 202, short wavelength components are mostly absorbed so that only long wavelength components of the emission spectrum are emitted from the first edge face 101.

Therefore, this example can realize an optical spectrum over a further broader band when compared with Example 1 and Example 2.

As an example, an electric current of 123.3 mA was injected into a 0.33 mm-long first electrode and an electric current of 6.4 mA was injected into a 0.30 mm-long second electrode, while the length of the emission spectrum modulation region was made to be equal to 1.50 mm and an electric current of 46.9 mA was injected into a 0.25 mm-long third electrode. Then, the spectral half width of light emitted from the side of the first edge face 101 was 95 nm and an optical output of 10.1 mW was obtained.

Thus, in the SLD of this example, the light emitted from the first edge face is constituted by contributions from a plurality of light emitting regions as described above. Therefore, a feedback technique that is different from any comparable conventional techniques is required to control the current injection amount to each of the light emitting regions for the purpose of correcting the changes that may occur in the beam characteristics due to changes in the environment and also changes with time.

Particularly, as clearly seen from FIG. 9B, long wavelength side components that are optical spectrum components of light generated at the third light emitting region 402 exert only a small influence to the optical output. However, with regard to applications of the present invention including optical coherence tomography apparatus, the feedback control of the current injection amount for the third light emitting region 402 is vitally important because the emission spectral half width delicately contributes to the resolution of such devices. Additionally, unlike the second light emitting region 401, a current injection that is as high as the current injection into the first light emitting region 201 is required for the third light emitting region 402. Degradation of the active layer and the periphery thereof depends on the electric current injection density to a large extent and therefore the operation of grasping the condition of the third light emitting region is substantially as important as the operation of grasping the condition of the first light emitting region.

Now, the feedback technique to be used for the SLD of this example will be described below.

The structure of the SLD 400 of this example in cross section is mostly similar to that of the SLD 200 of Example 1. Therefore, only the parts that are different from those of Example 1 will be described below.

FIG. 12B illustrates the structure in cross section of the SLD taken along the dotted line 410 in FIG. 12A. While the same active layer is employed for the light receiving sections 404 and 407 and also for the light emitting regions 201, 401 and 402 in this example, the present invention is by no means limited to the use of the same active layer. Alternatively, the light receiving sections and the light emitting regions may be prepared separately by using different substrate. Still alternatively, a single substrate may commonly be used for the light receiving sections and the light emitting regions but different active layers may be formed on the respective substrates.

Referring to FIG. 12B, the structure in cross section illustrated at the left side is that of the third light emitting region 402 and the structure in cross section illustrated at the right side is that of the second light receiving section 407. The amount of received light is made to be detectable by applying a bias voltage to the upper electrode 411 of the second light receiving section 407 that is reverse to the bias voltage being applied to the third light emitting region 402.

In case where the spontaneous emission light component from the third light emitting region 402 influences the feedback control, a cover 412 is formed on the edge face of the active layer part of the second light receiving section 407 that is located at the side of the third light emitting region 402 so as not to receive the spontaneous emission component. The cover 412 may be of any type so long as it can reduce the amount of the transmitted spontaneous emission light component. When, for example, the cover 412 is formed by a material same as that of the upper electrode 411, the cover 412 needs to be electrically isolated from the upper electrode 411 so that no connection may take place between them.

In this example, the light receiving sections are formed on the substrate on which the SLD main body is also formed and the same active layer is used for them. However, the present invention is by no means limited to such an arrangement and each of the light receiving sections may alternatively be formed by using a substrate and an active layer that are different from those of the SLD main body. The light receiving sections may be arranged at the respective opposite edge face sides of the SLD as in the case of Example 1.

Figure 10:
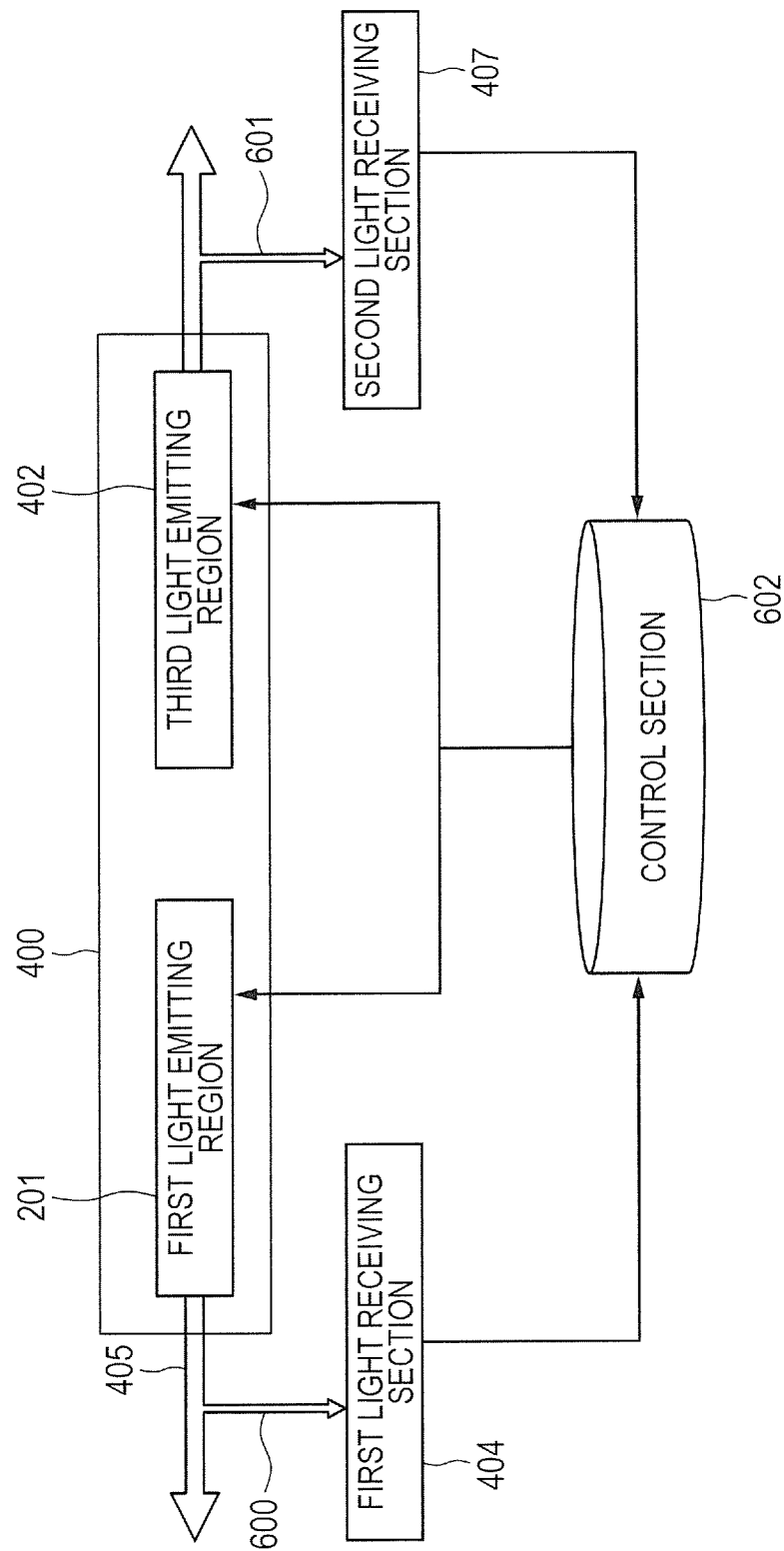
FIG. 10 is a schematic illustration of the SLD control method of Example 3.

FIG. 10 is a schematic illustration of the technique for feedback control of the SLD 400 of this example. While the SLD 400 is being driven, the output of the first light receiving section 404 and that of the second light receiving section 407 (the first piece of optical information and the second piece of optical information) are separately monitored and the control section 602 controls the current injection amount of the first current injection region (first light emitting region) 201 and that of the third current injection region (third light emitting region) 402.

Part of light 600 of the emission light 405 output from the side of the first edge face of the SLD 400 is reflected by a first anti-reflection film (half mirror) 403 (FIG. 12A) and enters the first light receiving section 404 formed monolithically near the edge face.

Assume that the initial value of the output of the first light receiving section 404 is A and the permissible range of the initial value is ±α. When the value of the output of the first light receiving section 404 is found to be out of the range of A±α, the current injection amount into the first light emitting region 201 is adjusted so as to make the output value to be confined within the range of A±α.

As pointed out above, the amount of light that enters the first light receiving section 404 largely depends on the amount of injection current into the first light emitting region 201. Therefore the overall light emission level can be held to a substantially constant level by adjusting the current injection amount into the first light emitting region 201 according to the output value of the first light receiving section 404.

However, as described above, light emitted from the light emitting regions other than the first light emitting region 201 contributes to changes in the optical spectral half width to a large extent. Therefore, a control operation as described below is additionally required to adjust the condition of light emission of the SLD 400.

Light 601 output from the side of the second edge face 105 of the SLD 400 is reflected by the second anti-reflection film (half mirror) 406 (FIG. 12A) and enters the second light receiving section 407. Assume here that the initial value of the output from the second light receiving section 407 is B and the permissible range of the output is +β. When the value of the output from the second light receiving section 407 is found to be out of the range of B±β the current injection amount into the third light emitting region 402 is adjusted so as to make the value to be confined within the range of B±β.

The components of the light received by the second light receiving section 407 include mainly long wavelength components of light from the first light emitting region 201 and the second light emitting region 401 and the light beam of the entire wavelength region from the third light emitting region 402 due to the operation of the emission spectrum modulation region 202. In terms of light amount, light from the third light emitting region 402 is the major contributor.

Therefore, the overall light emission of the SLD can be held to a constant level by adjusting the current injection amount into the third light emitting region 402 relative to the output of the second light receiving section 407.

Note that the adjustment of the current injection value into the first light emitting region 201 and the adjustment of the current injection value into the third light emitting region 402 are conducted not simultaneously but alternately. While the current injection value into one of the light emitting regions is being adjusted, the current injection value of the other light emitting region is held to be constant.

The operation of controlling the current injection values is repeated until the output values from the two light receiving sections are found within the respective predefined ranges. If at least either of the two output values would not be confined within the related predefined range, either the power supply to the light source is suspended or a warning signal is output.

As the above-described adjustment operation is conducted, the current injection into the SLD 400 can be adjusted by observing not only the optical output but also the spectral shape as data to be taken into consideration for determining the control operation.

The contribution of light beam components from the first light emitting region 201 and the second light emitting region 401 to the value of the detected light at the second light receiving section 407 can be reduced by adding the feature of a long wave cutting filter to the second anti-reflection film 406.

In order to realize a broad spectral band for the entire light beam output of the SLD 400, a high electric current needs to be injected into the third light emitting region 402. In such a case, the optical output from the third light emitting region 402 principally includes short wavelength components as illustrated in FIG. 6.

Therefore, the condition of the third light emitting region 402 can more clearly be detected and controlled by adding a feature of reducing the light emission from the ground level and also the optical output of longer wavelength components to the second anti-reflection film 406 so as to selectively allow light of short wavelengths to enter the photodetector.

For an anti-reflection film having such an additional feature, for example, a multilayered film formed by laying two $SiO_xN_y$ layers having different refractive indices up to the thickness of λ/4 can advantageously be employed.

The feature of cutting long wavelength components may not necessarily be realized by using an anti-reflection film having an additional feature of cutting long wavelength components as described above. The feature of cutting long wavelength components is only required to be provided between the output edge face of the SLD and the light receiving surface of the light receiving section. For example, the multilayered film may alternatively be formed on the light receiving surface of the light receiving section or a low pass filter may be arranged between the output edge face of the SLD and the light receiving surface of the light receiving section.

However, with the arrangement of making the anti-reflection film to be provided with a feature of cutting long wavelength components, the device can be downsized and the number of parts can be reduced. Then, cost reduction of the SLD can be expected.

The device can be downsized by forming the light receiving section and the light emitting regions on the same substrate. Additionally, the number of parts can be reduced and no adjustment operation is required for the optical axis of the light receiving section so that the number of adjusting steps can be further reduced to minimize the manufacturing cost.

While the SLD of this example has a plurality of current injection electrodes (light emitting regions) and the light receiving section is formed on the substrate of the SLD, the present invention is by no means limited to such an arrangement. In other words, if an SLD has only a single current injection electrode for injecting an electric current into the active layer, the light receiving section can also be formed on the same substrate to provide similar advantages.

Example 4

Figure 11:
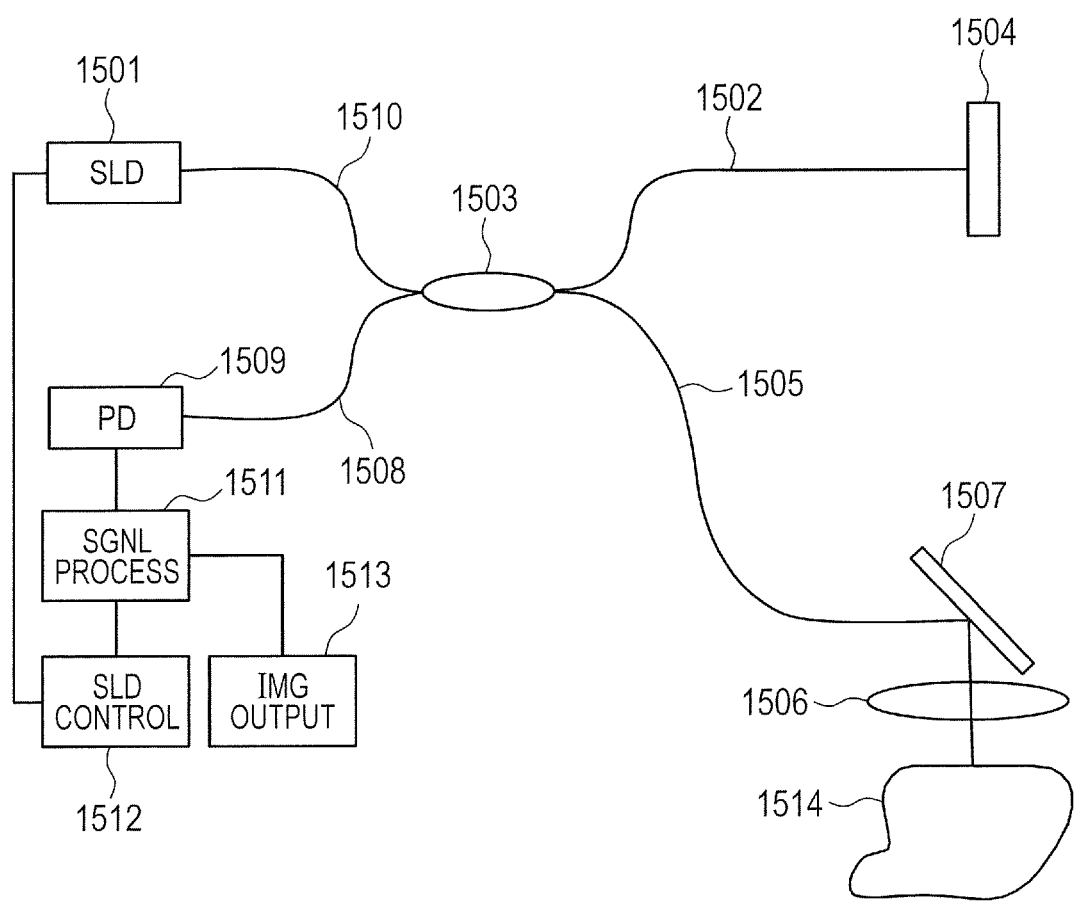
FIG. 11 is a schematic illustration of the arrangement of the OCT device of Example 4 using an SLD according to the present invention as light source.

In this example an optical coherence tomography apparatus (OCT apparatus) is prepared by using an SLD according to the present invention as light source. FIG. 11 is a schematic illustration of the optical coherence tomography apparatus of this example.

The optical coherence tomography apparatus of FIG. 11 basically includes a light source section, a specimen measuring section for irradiating a specimen with light from the light source section and transmitting the light reflected from the specimen, a reference section for irradiating a reference mirror with light and transmitting the light reflected from the reference mirror, an interference section for causing the light waves reflected from the two mirrors to interfere with each other, a light detecting section for detecting the interference of the light waves obtained by the interference section and an image processing section for executing an image processing operation (of obtaining a tomographic image) according to the light detected by the light detecting section. Now, each of the above-identified components will be described below.

The light source section is formed by arranging an SLD light source 1501 and a light source control section 1512 for controlling the SLD light source, of which the SLD light source 1501 is connected to a fiber coupler 1503 that forms the interference section by way of an optical fiber 1510 for irradiation of light.

The fiber coupler 1503 of the interference section is one that operates in a single mode in the wavelength band of the light source. A 3 dB coupler is used for the fiber coupler.

Reflection mirror 1504 is connected to fiber 1502 for forming the light path for reference light in order to form the reference section. The fiber 1502 for forming the light path for reference light is connected to the fiber coupler 1503.

The specimen measuring section is formed by a fiber 1505 for forming the light path for inspection light, a light irradiation/convergence optical system 1506 and an irradiation position scanning mirror 1507, of which the fiber 1505 for the light path for inspection light is connected to the fiber coupler 1503. At the fiber coupler 1503, the waves of backward scattering light that are produced in the inside and also on the surface of the specimen 1514 to be inspected and the waves of return light from the reference section interfere with each other to give rise to interfering light waves.

The light detecting section is formed by light receiving fiber 1508 and photodetector 1509 and the interfering light waves that are produced at the fiber coupler 1503 are guided to the photodetector 1509.

The light received by the photodetector 1509 is transformed into a spectral signal at signal processor 1511 and further subjected to Fourier transformation. As a result, depth information on the specimen 1514 is obtained. The obtained depth information is displayed on image output monitor 1513 as a tomographic image.

The signal processor 1511 can be formed by using a personal computer or the like. The image output monitor 1513 can be formed by using the display screen of a personal computer or the like.

The light source control section 1512 is connected to the signal processor 1511 that also controls the drive signal of the irradiation position scanning mirror 1507 and other signals so that the SLD light source 1501 is controlled in synchronism with the drive of the scanning mirror 1507.

When the light source described in Example 1 or 2 is employed as for the SLD light source 1501, the light source can provide an output that is stable in terms of both light amount and optical spectral shape so that the optical coherence tomography apparatus can obtain tomographic image information for a long time on a stable basis. Additionally, the optical coherence tomography apparatus can immediately detect a situation where not only the light amount but also the optical spectral shape are out of the predetermined respective ranges so that the device can highly safely operate.

The OCT device is effective and useful for tomographic imaging in the fields of ophthalmology, dentistry, dermatology and so on.

While an OCT device is described in this example, the scope of application of the present invention is by no means limited to such an OCT device and an SLD according to the present invention can find applications in the field of light sources of OCT apparatus of other types.

Thus, the present invention provides an advantage of controlling both the optical output and the spectral shape of an SLD easily and accurately within a short period of time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-159791, filed Aug. 13, 2015, which is hereby incorporated by reference herein in its entirety.

What is claimed is:

1. A light emitting device comprising:
a laminate including:
a lower electrode, a lower clad layer, an active layer, an upper clad layer, and an upper electrode in this order, the lower clad layer, the active layer, and the upper clad layer constituting an optical waveguide layer,
the optical waveguide layer having a first edge face and a second edge face on opposite ends in a light guiding direction of the optical waveguide layer such that light guided though the optical waveguide layer is emitted in a guided direction from either of the first edge face and the second edge face,
wherein light emitted from the first edge face represents beam characteristics different from beam characteristics of light emitted from the second edge face,
wherein the light emitting device further comprises:
a first photodetector that receives an optical power of the light emitted from the first edge face and generates a first piece of optical information;
a second photodetector that receives an optical power of the light emitted from the second edge face and generates a second piece of optical information; and
a control section configured to execute a first adjusting step of adjusting a current injection amount into either one of the upper electrode and the lower electrode according to the first piece of optical information and subsequently execute a second adjusting step of adjusting a current injection amount into either one of the upper electrode and the lower electrode according to the second piece of optical information.

2. The device according to claim 1, wherein the optical waveguide layer has an emission spectrum modulation region.

3. The device according to claim 1, wherein the upper electrode is divided into a plurality of parts.

4. The device according to claim 1, wherein the beam characteristics include one selected from a mean value of output power, a change with time of output power, a spectrum, a radiation angle and a polarization direction of the light emitted from the light emitting device.

5. The device according to claim 1, wherein at least either one of the first photodetector and the second photodetector converges the light emitted from the first edge face or the second edge face into an optical fiber, receives an optical power of the converged light by means of the first photodetector and the second photodetector arranged at a distal end branched from the optical fiber and generates optical information from the light received by the first photodetector and the second photodetector.

6. The device according to claim 5, wherein the device is provided with a wavelength filter for selecting optical wavelengths of light entering the photodetector.

7. The device according to claim 1, wherein at least either one of the first and second light receiving sections branches the light emitted from the first or second edge face by means of a half mirror, receives an optical power of the branched light by means of a photodetector and generates optical information from the light received by the photodetector.

8. The device according to claim 7, wherein the device is provided with a wavelength filter for selecting optical wavelengths of light entering the photodetector.

9. The device according to claim 1, wherein at least either one of the first and second light receiving sections comprises a photodetector formed monolithically near the first or second edge face so as to receive the light reflected by the first or second edge face, whichever appropriate.

10. The device according to claim 9, wherein the device is provided with a wavelength filter for selecting optical wavelengths of light entering the photodetector.

11. The device according to claim 1, wherein the active layer has a multiple quantum well structure and either well layers or barrier layers that form the multiple quantum well structure have an asymmetric quantum well structure of not being totally identical in terms of composition or thickness.

12. A method of controlling a light emitting device according to claim 1, wherein the control section executes:
- a step of adjusting a value of the current injection into the upper electrode so as to confine a specific value in the first piece of optical information as defined above within a predefined range;
- a step of determining a specific value in the second piece of optical information as defined above as being confined within a predetermined range or not; and
- a step of outputting a signal in case of determining the specific value in the second piece of information as not being confined within the predetermined range.

13. A method of controlling a light emitting device according to claim 3, wherein the control section executes:
- a first determining step of determining whether a specific value in the first piece of optical information is within a predefined range or not;
- a first adjusting step of adjusting, in case that the specific value in the first piece of optical information is not within the predefined range, an injection current value into one of the two or more than two upper electrodes so as to confine the specific value within the predefined range;
- a second determining step of determining whether a specific value in the second piece of optical information is within a predefined range or not; and
- a second adjusting step of adjusting, in case that the specific value in the second piece of optical information is not within the predefined range, an injection current value into the other one of the two or another one of the more than two upper electrodes so as to confine the specific value within the predefined range,
- wherein the first adjusting step and the second adjusting step are not executed simultaneously.

14. The device according to claim 1, wherein the device has a ridge type waveguide.

15. The device according to claim 1, wherein the control section is configured to execute the first adjusting step and the second adjusting step alternately.

16. The device according to claim 1, wherein control section is configured to execute the first adjusting step and the second adjusting step not simultaneously.

17. The device according to claim 1, wherein the first adjusting step and the second adjusting step are executed repeatedly until the light amount detected by the first photodetector and the light amount detected by the second detector are found to be within respective predefined ranges.

18. The device according to claim 1, wherein the first piece of optical information and the second piece of optical information are generated based on light detected at the same time by the first photodetector and by the second photodetector.

* * * * *